US007545079B2

(12) United States Patent
Oliver

(10) Patent No.: US 7,545,079 B2
(45) Date of Patent: Jun. 9, 2009

(54) PHOTOETCHED ULTRASOUND TRANSDUCER COMPONENTS

(75) Inventor: Nelson H. Oliver, Sunnyvale, CA (US)

(73) Assignee: Siemens Medical Solutions USA, Inc., Malvern, PA (US)

( * ) Notice: Subject to any disclaimer, the term of this patent is extended or adjusted under 35 U.S.C. 154(b) by 575 days.

(21) Appl. No.: 11/092,015

(22) Filed: Mar. 28, 2005

(65) Prior Publication Data

US 2005/0234341 A1 Oct. 20, 2005

Related U.S. Application Data

(60) Provisional application No. 60/559,134, filed on Apr. 1, 2004.

(51) Int. Cl.
*H01L 41/00* (2006.01)

(52) U.S. Cl. ....................................... 310/326; 600/459

(58) Field of Classification Search .................. 310/326
See application file for complete search history.

(56) References Cited

U.S. PATENT DOCUMENTS 5,742,314 A * 4/1998 Hayes ......................... 347/93
6,025,048 A * 2/2000 Cutler et al. ................ 428/105
6,330,831 B1 * 12/2001 Lynnworth et al. ....... 73/861.28
6,571,444 B2 * 6/2003 Mauchamp et al. ........ 29/25.35
2002/0165451 A1 * 11/2002 Phelps et al. ................ 600/437

OTHER PUBLICATIONS

"A New 3D, Direct-Write, Sub-Micron Microfabrication Process that Achieves True Optical, Mechatronic and Packaging Integration on Glass-Ceramic Substrates," by Raymond Karam and Richard J. Casler; Invenios, Incorporated; dated Apr. 1, 2003; 8pgs.

* cited by examiner

*Primary Examiner*—Quyen P Leung
*Assistant Examiner*—Bryan P Gordon

(57) ABSTRACT

A photoetchable glass ceramic is used to form a three dimensional structure for a transducer component. This photostructurable material allows generation of various shapes or structures. For example, a matching layer is formed, in part, using photoetchable glass ceramics with an anechoic-shaped gradient structure. The gradient structures are then filled with materials having desired impedance properties. By allowing generation of desired structures within the matching layer, a desired acoustic impedance property may be provided. As another example, a hollow column is photo etched and used for providing air backing in a backing layer. As yet another example, a transducer layer is formed within a framework of photostructurable material. A plurality of holes with associated shelves is provided for pick-and-place locating of transducer elements within an array. The photostructurable material assists in manufacturing.

12 Claims, 1 Drawing Sheet

PHOTOETCHED ULTRASOUND TRANSDUCER COMPONENTS

RELATED APPLICATIONS

The present patent document claims the benefit of the filing date under 35 U.S.C. § 119(e) of Provisional U.S. Patent Application Ser. No. 60/559,134, filed Apr. 1, 2004, which is hereby incorporated by reference.

BACKGROUND

The present invention relates to ultrasound transducers. In particular, three dimensional structures are formed for components in an ultrasound transducer.

Medical diagnostic ultrasound transducers include a stack of layers. For example, a transducer layer is sandwiched between one or more matching layers and a backing layer. The transducer stack is relatively small, such as supporting an array of elements with a sub-millimeter pitch and thickness. Due to the small size of the transducer, the complexity of structures useable within a transducer stack is limited. For example, various matching layer structures for graduated or desired acoustical impedance have been proposed but are costly or difficult to manufacture.

BRIEF SUMMARY

By way of introduction, the preferred embodiments described below include improvements to ultrasound transducers and methods for manufacturing ultrasound transducers. A photoetchable glass ceramic is used to form a three dimensional structure for a transducer component. This photostructurable material allows generation of various shapes or structures. For example, a matching layer is formed, in part, using photoetchable glass ceramics with an anechoic-shaped gradient structure. The gradient structures are then filled with materials having desired impedance properties. By allowing generation of desired structures within the matching layer, a desired acoustic impedance property may be provided. As another example, a hollow column is photo etched and used for providing air backing in a backing layer. As yet another example, a transducer layer is formed within a framework of photostructurable material. A plurality of holes with associated shelves is provided for pick-and-place location of transducer elements within an array. The photostructurable material assists in manufacturing.

In a first aspect, an improvement is provided for an ultrasound transducer with a matching layer, transducer layer and backing layer. The improvement includes using a photoetchable glass ceramic component within the ultrasound transducer.

In a second aspect, a method is provided for manufacturing an ultrasound transducer. A component of the ultrasound transducer is microfabricated from a photoetchable glass ceramic. The component is stacked in a transducer stack.

In a third aspect, an ultrasound transducer is provided with a three dimensional structure. A transducer layer is positioned adjacent to a matching layer. A backing layer is positioned adjacent to the transducer layer. At least one of the matching layer, transducer layer and backing layer includes the three dimensional structure formed in a photostructurable material.

The present invention is defined by the following claims, and nothing in this section should be taken as a limitation on those claims. Further aspects and advantages of the invention are discussed below in conjunction with the preferred embodiments.

BRIEF DESCRIPTION OF THE DRAWINGS

The components and the figures are not necessarily to scale, emphasis instead being placed upon illustrating the principles of the invention. Moreover, in the figures, like reference numerals designate corresponding parts throughout the different views.

DETAILED DESCRIPTION OF THE DRAWINGS AND PRESENTLY PREFERRED EMBODIMENTS

A photoetchable glass-ceramic, such as Shott Foturan®, is used to create 3-D structure for components of an ultrasound transducer. Matching or backing layers for specialized transducer applications are created. Example applications include very low density and low impedance matching layers, backing materials with uniaxial electrical conductors in the Z direction, and structures for configuring graded-impedance matching layers.

Figure 1:
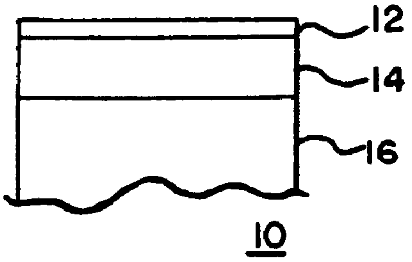
FIG. 1 is a side view of one embodiment of a transducer stack.

FIG. 1 shows one embodiment of an ultrasound transducer 10. The ultrasound transducer 10 is used for medical diagnostic imaging. For example, the ultrasound transducer 10 is a one or two dimensional array of elements for phased array imaging. The ultrasound transducer 10 includes a plurality of layers, such as a matching layer 12, transducer layer 14 and backing layer 16. Additional, different or fewer layers may be provided. For example, two or three matching layers 12 are provided. As another example, a grounding plane, electrode layer or a flex circuit or other signal conductor layers are provided within the stack of the ultrasound transducer 10.

The layers 12, 14, 16 are any now known or later developed structure or material. The ultrasound transducer 10 includes at least one component of photoetchable glass ceramic. Photoetchable glass ceramics include lithium aluminosilicate glass-ceramic. Other photostructurable materials may be provided. In one embodiment, Foturan® from Shott is provided. Photostructurable material allows writing or forming of a boundary on or under a surface of the material. An ultraviolet or other laser is focused to areas or volumes of desired removal to form a three dimensional boundary. A chemical etch is then used to remove or allow separation of material to expose the boundary. Such photostructurable materials may provide for large aspect ratios, square profiles, moving parts, or other three dimensional structures with a desired profile. For example, structures formed with a more complex surface, such as a tapered surface, than can be generated with a drill or dicing saw may be provided. Since the laser may be focused within the photostructurable material, the formed surface or structure has a three dimensional configuration as opposed to a simple two dimensional configuration.

The matching layer 12 is a solid material or a composite material. As a composite, a photoetchable glass ceramic component is filled with or mated to other material. Cast filler of silicone, epoxy, or other material with the desired acoustical impedance is used. Filler material otherwise unsuitable for bonding or dicing, yet yielding lower impedance, may be provided since the photoetchable glass ceramic provides structure of the matching layer 12.

Figure 2:
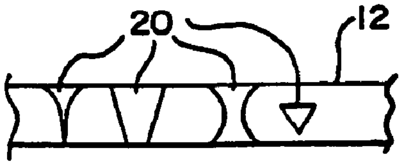
FIG. 2 is a partial cut-away view of a matching layer in one embodiment.

The photoetchable glass ceramic is used to form any of various desired three dimensional structures within the matching layer 12. FIG. 2 shows four different possible structures 20. Tapered divots, tapered holes, tapered grooves, combinations thereof or other three dimensional structures may be provided. In one embodiment, a same three dimensional structure 20 is provided throughout the matching layer 12. In alternative embodiments, different structures 20 are provided within the same matching layer 12. The tapering may be a linear or non-linear taper. Any now known or later developed three dimensional structure within the matching layer 12 for filling or maintaining free of filler to provide a desired acoustic impedance matching layer characteristic may be used.

The matching layer 12 has a desired acoustic impedance or a desired variation in acoustic impedance from one surface to another surface. Holes through the entire matching layer 12 or within the matching layer 12 may provide desired acoustic impedance properties. Divots extending partially into but not through the matching layer 12 may also provide desired acoustic impedance properties. Anechoic-shaped gradient structures may more likely avoid acoustic reflections by more gradually matching acoustic impedance of the transducer to a skin or patient surface.

FIG. 2 shows the matching layer 12 formed out of a structure of photoetchable class ceramic. In alternative embodiments, the photoetchable glass ceramic is used to form a mold. The filler or other casting material is then molded for forming the actual matching layer. Mated molds may be provided for forming different portions of the matching layer 12 for combination together for a single matching layer 12. The use of the photostructurable material may minimize or avoid multiple dicing, filling and plating steps.

The matching layer 12 is electrically conductive or an electrical insulator. Where electrical signals, such as a ground or transmit and receive signals, are to be passed through the matching layer 12, electrically conductive plating or filler may be provided in through-holes or three dimensional structures 20 passing through the entire matching layer 12. Alternatively, the three dimensional structures 20 used for tailoring the acoustic impedance are plated prior to filling for providing uniaxial electrical conductivity from the top to the bottom of the matching layer 12. Non conductive fillers may be used.

Figure 3:
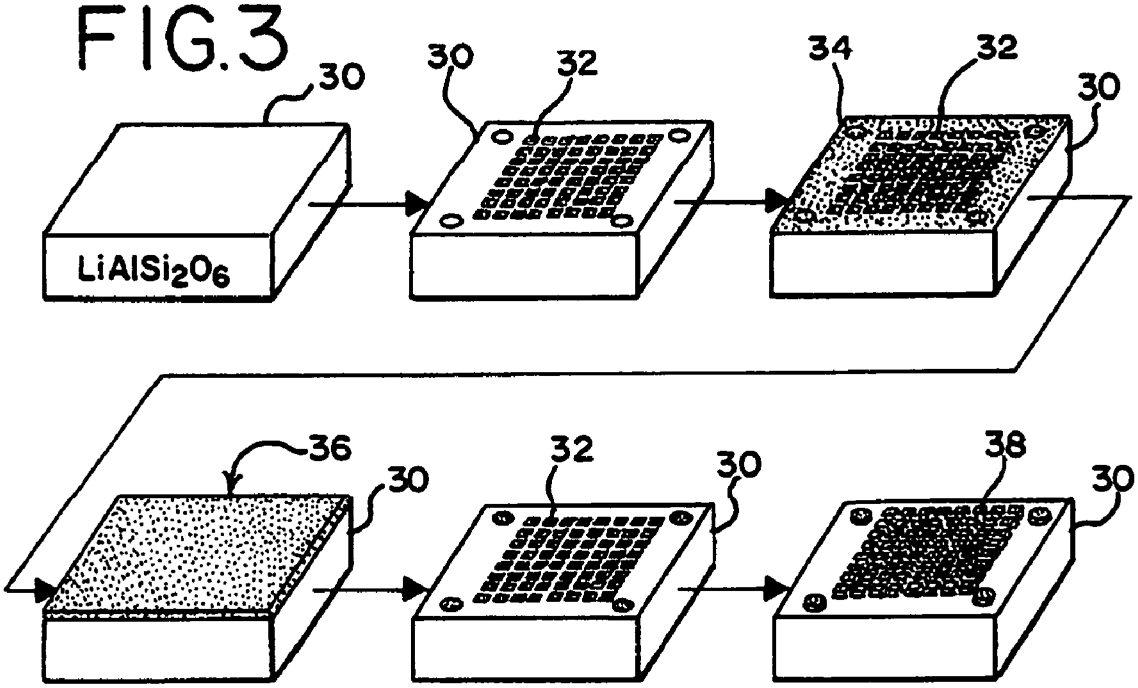
FIG. 3 shows processing steps for forming a transducer layer using photostructurable material in one embodiment.

Alternatively or additionally, the photostructurable material is used as part of the transducer layer 14. For example, the photoetchable glass ceramic is used as a frame for holding a plurality of elements. FIG. 3 shows one embodiment of photoetchable glass ceramic block 30 being used as a frame for a multi-dimensional array of elements. The photoetchable glass ceramic 30 is of any desired dimension, such as ½ a millimeter to 10 millimeters thickness with a width and length dimension associated with the desired array and array shape. A plurality of holes 32 is formed within the block 30 of photoetchable glass ceramic. The holes 32 are square, hexagonal, round, triangular or other shape. Hexagonal shaping may minimize generation of grating lobes. Each of the holes 32 is sized and shaped for insertion of a piezoelectric or other transducer element.

The photoetchable glass ceramic is metalized or plated with a metal layer 34. For example, electrolysis, evaporation, sputtering or another technique is used to provide gold or other material in a desired pattern within the holes 32 or on other surfaces of the block 30. For example, one or more electrically isolated conductors are formed within each of the holes 32 for routing signals to the top or bottom of the holes 32. Etching, grinding, masking or other techniques may be used to remove or prevent any undesired metallization.

Individual elements are picked and placed within the holes 32. Alternatively, a slab or linear extent of elements are picked and placed within grooves formed within the photoetchable glass ceramic block 30. Dicing then separates the elements along an additional dimensional. For a multi-dimensional transducer array, the elements are single or multi-layer PZT elements. For example, elements with three to five layers of PZT are pre-formed with inter-connected electrodes. The elements may include matching layers or matching layers may be formed after placement of the elements within the photostructurable material block 30.

When the holes 32 are formed, shelves are formed in each of the holes 32. The shelf may be a bump, protrusion, narrowing of the hole 32 or other structures for mechanically supporting the elements within the holes 32. Photoetching allows formation of three dimensional shapes, allowing the shelves for maintaining position of the elements. Metalized plating 34 extends upward from the shelves for connecting a bottom electrode to a top surface or downward from the shelves for connecting bottom electrode, top electrode or both bottom and top electrodes to a back surface of the photostructurable material block 30. Metalizing thus provides for a Z-axis or uniaxially conductive routing of signal or ground traces.

To maintain elements within the holes 32, a cast backer may be formed on a top or bottom of the holes 32 after the elements are positioned. For example, a non-conductive silicone is provided. Alternatively, electrically conductive filler is provided. In yet other alternative embodiments, the filler is positioned within the holes 32 prior to placement of the elements. The excess filler 36 is then ground or otherwise removed to isolate the elements in each of the associated holes 32. Where conductive matching layers are provided, the elements may be positioned within the holes 32 to extend above the photostructurable material block 30, and grinding may be avoided. The filler 36 is controlled such that the filler does not extend above the electrically conductive matching layers.

Any additional matching layers, grounding electrodes or other materials 38 are formed on each of the elements within the holes 32 or across the entire frame provided by the photostructurable material 30.

Figure 4:
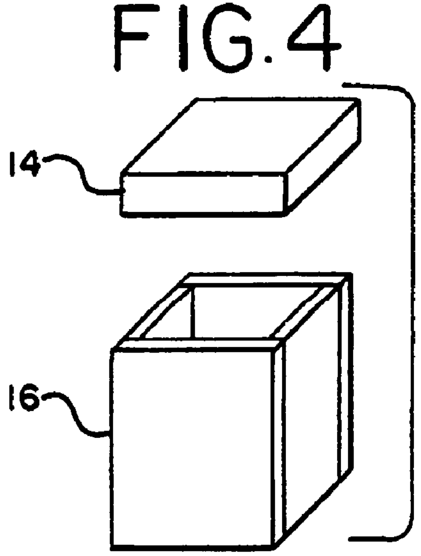
FIG. 4 is a perspective view of one embodiment of a backing layer formed from photostructurable material.

In yet another alternative or additional embodiment, the photoetchable glass ceramic is used for the backing layer 16 (see FIGS. 1 and 4). For example, the frame provided by the photostructurable material block 30 of FIG. 3 has sufficient height that a portion of the holes 32 beneath the shelves serves as an air backing. Any metallization within the holes 32 is routed through the air backing for Z-axis or uniaxial conductivity within the backing. Flip chip technology using bump or polymer bump bonding or other circuit connection is then provided on the bottom on the photostructurable material block 30 and associated air backing for routing signals to and from the elements. In one embodiment, the circuit board for bump bonding to the back of the photostructurable block 30 acting as Z-axis backing block routes the signals laterally away from the array. A multiple level board is provided for a staggered exposure of different conductors routed to different elements. The staggered exposure, such as providing 3, 4 or 5 or more levels in the same board, more efficiently routes the many traces for a two dimensional array. Alternatively, flexible circuits or other materials on the top or bottom of the photostructurable material block 30 route signals to or from the elements. Alternatively, signal traces are formed within or on backing layer 16. Using photostructurable material, different routes or tunnels may be provided for metallizing within the backing layer 16. Electrical traces may be provided for Z-axis backing or other electrical routing to the side surfaces of the backing layer 16 for a more spread exposure of different signal lines.

FIG. 4 shows an additional or alternative backing layer 16 formed from photoetchable glass ceramic. A hollow column is formed from a single or plurality of pieces of photoetchable glass ceramic. The hollow portion is sized or shaped to provide air backing or other backing for a portion or the entire array of elements. A transducer layer 14 is positioned over the hollow column of the backing layer 16. In one embodiment, the hollow column is filled with additional acoustic absorbing material other than air. Further structures for absorbing acoustic energy may be provided within the backing layer, such as pyramidal shapes formed on the surface within the hollow portion of the backing layer 16. Other sound reflecting, deflecting or absorbing structures may be formed.

Figure 5:
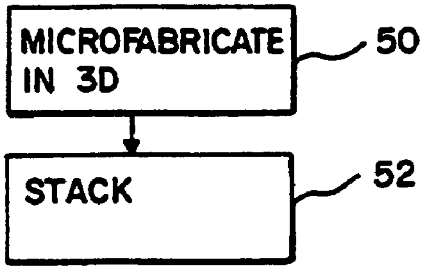
FIG. 5 shows one embodiment of a method for manufacturing an ultrasound transducer.

FIG. 5 shows one embodiment of a method for manufacturing an ultrasound transducer using photoetchable glass ceramic. The method is performed to form the same or different structures than described in FIGS. 1 through 4. Any of the matching layer, transducer layer or backing layer is formed from the photoetchable glass ceramic.

In act 50, a component of the ultrasound transducer is manufactured from a photoetchable glass ceramic. The photoetchable glass ceramic is used as a mold to form a component or is used as an actual piece of the component. The microfabrication is performed by transmitting ultraviolet light or other light to change a crystal structure of the photoetchable glass ceramic in a three dimensional volume within or on the photostructurable material. The photostructurable material is then exposed to a chemical etch. The altered crystalline structure is weakened or removed by the chemical etch. As a result, the structure with the desired three dimensional shape is formed by material removal.

In act 52, various layers of the transducer are stacked. One or more of the layers includes at least one component formed from the photoetchable glass ceramic. For example, one or more of the layers includes a photoetchable glass ceramic. As another example, one or more of the layers includes a structure molded from a mold made of photoetchable glass ceramic. The stacked ultrasound transducer is used for generating and receiving acoustic energy. Medical diagnostic imaging is performed using an array formed from the transducer stack. The transducer stack may be used in other types of sonography.

While the invention has been described above by reference to various embodiments, it should be understood that many changes and modifications can be made without departing from the scope of the invention. It is therefore intended that the foregoing detailed description be regarded as illustrative rather than limiting, and that it be understood that it is the following claims, including all equivalents, that are intended to define the spirit and scope of this invention.

I claim:

1. In an ultrasound transducer with a matching layer, transducer layer, and a backing layer, an improvement comprising:

a photoetchable glass ceramic component, wherein the photoetchable glass ceramic component comprises the matching layer and includes a plurality of anechoic-shaped gradient structures filled with other material.

2. The improvement of claim 1 wherein the photoetchable glass ceramic component comprises lithium aluminosilicate glass-ceramic.

3. The improvement of claim 1 wherein the matching layer comprises the photoetchable glass ceramic component with tapered divots, tapered holes, tapered grooves or combinations thereof filled with other material.

4. The improvement of claim 1 wherein the photoetchable glass ceramic component comprises the transducer layer.

5. The improvement of claim 4 wherein the transducer layer comprises a plurality of elements within a frame comprising the photoetchable glass ceramic component.

6. The improvement of claim 5 wherein the frame includes a plurality of shelves holding the plurality of elements within the frame.

7. The improvement of claim 1 wherein the photoetchable glass ceramic component comprises the backing layer.

8. The improvement of claim 7 wherein the backing layer comprises a hollow column of the photoetchable glass ceramic.

9. An ultrasound transducer with a three-dimensional structure, the ultrasound transducer comprising:

a matching layer;

a transducer layer adjacent the matching layer; and a backing layer adjacent the transducer layer;

wherein the matching layer comprises the three-dimensional structure formed in a photostructurable material, and the three-dimensional structure comprising an anechoic-shaped gradient structure.

10. The ultrasound transducer of claim 9 wherein the photostructurable material comprises a lithium aluminosilicate glass-ceramic.

11. The ultrasound transducer of claim 9 wherein the transducer layer comprises the three-dimensional structure formed in the photostructurable material, the three-dimensional structure comprising a plurality of holes with a respective plurality of shelves.

12. The ultrasound transducer of claim 9 wherein the backing layer comprises the three-dimensional structure formed in the photostructurable material, the three-dimensional structure comprising a hollow column of the photostructurable material.

* * * * *